United States Patent [19]
Itoh

[11] Patent Number: 5,308,920
[45] Date of Patent: May 3, 1994

[54] HEAT RADIATING DEVICE

[75] Inventor: Satomi Itoh, Hyogo, Japan

[73] Assignee: Itoh Research & Development Laboratory Co., Ltd., Osaka, Japan

[21] Appl. No.: 923,344

[22] Filed: Jul. 31, 1992

[51] Int. Cl.$^5$ .............................................. H05K 7/20
[52] U.S. Cl. .................................. 174/15.2; 174/16.3; 174/17 LF; 439/487
[58] Field of Search ................ 174/8, 15.1, 15.2, 16.3, 174/17 R, 17.06, 17 LF, 16.1, 52.4; 439/485, 487; 257/715

[56] References Cited

U.S. PATENT DOCUMENTS

| | | | |
|---|---|---|---|
| 3,361,195 | 1/1968 | Meyerhoff et al. | 174/16.3 X |
| 3,489,207 | 1/1970 | Miller | 174/15.1 X |
| 3,909,678 | 9/1975 | Rifkin et al. | 174/15.1 X |
| 3,952,797 | 4/1976 | Voboril et al. | 174/15.2 X |
| 4,011,535 | 3/1977 | Kosky et al. | 174/15.1 X |
| 4,322,737 | 3/1982 | Sliwa, Jr. | 257/715 X |
| 5,148,351 | 9/1992 | Patel | 174/15.1 X |

FOREIGN PATENT DOCUMENTS 1006531 4/1957 Fed. Rep. of Germany ..... 174/15.1

*Primary Examiner*—Peter Dungba Vo
*Attorney, Agent, or Firm*—W. G. Fasse

[57] ABSTRACT

A radiating device for radiating heat of an electronic component to the atmosphere, includes a container body, a cap for tight-sealing the inner space of the container body, and a working fluid serving as a heat carrier kept in the container body. The bottom wall of the container body is flat and serves as a heat receiving portion. The working fluid repeats evaporation and condensation in the container body. In a corner where the inner surface of the bottom wall of the container body meets the inner surface of a vertical cylindrical wall, a loop groove is formed running all along the corner. A plurality of horizontal grooves intersecting the loop groove are formed on the inner surface of the bottom wall. A plurality of second grooves intersecting the loop grooves are formed on the inner surface of the cylindrical wall. The working fluid condensed at the heat radiating portion returns to the bottom wall through the vertical grooves and through the loop groove. The working fluid which has returned is dispersed entirely over the inner surface of the bottom wall along the horizontal grooves.

12 Claims, 4 Drawing Sheets

HEAT RADIATING DEVICE

FIELD OF THE INVENTION

The present invention relates to a heat radiating device for radiating heat of an electronic component such as a semiconductor integrated circuit package to the atmosphere.

BACKGROUND INFORMATION

Recently, a higher responsiveness and a higher integration of integrated circuits used for electronic devices such as computers, have been in greater demand. Accordingly, power consumption density of an integrated circuit has been increased, and the temperature of the electronic component in operation has been increased. In order to cool the electronic component, a radiating device such as a heat sink has been used.

FIG. 1 shows a conventional radiating device 2 placed on a semiconductor integrated circuit package 1. The radiating device 2 includes a thin rectangular base plate 3 which is in surface-contact with the top surface of the semiconductor integrated circuit package 1, and a number of fins 4 are erected on the top surface of the base plate 3 so as to increase the surface area of the radiating device. Typically, the radiating device 2 is made of aluminum. The heat of the semiconductor integrated circuit package 1 is transmitted to the radiating device 2, and is radiated to the atmosphere from the surface of radiating device 2.

FIG. 2 shows a conventional fin type radiating device 5. The radiating device 5 includes a circular base plate 6 which is in surface-contact with the top surface of the semiconductor integrated circuit package, and a plurality of fins 7 are erected on the top surface of the base plate 6 so as to increase the surface area of the radiating device. Typically, the radiating device 5 of this type is also made of aluminum.

In the conventional radiating device such as shown in FIGS. 1 and 2, the effect of radiation is improved by increasing the surface area. However, such conventional device does not provide a satisfactory cooling effect when used with electronic components that generate increased heat outputs and require a higher responsiveness and a higher integration and are in increased demand.

A heat pipe has been known as another example of a radiating device for cooling an electronic component. A heat pipe is obtained by reducing the inner pressure of an air tight container formed by closing both ends of a pipe, and by sealing a heat carrier such as water or alcohol in the enclosed space. The leaf carrier is called a working fluid. At a heated portion of the heat pipe, the fluid turns to steam or gas, the gas radiates heat when it moves away from the heated portion, and turns into liquid. The liquid returns to the heated portion because of capillary action. The heat is transmitted from the heated portion to the radiating portion by the repetition of this phenomenon.

A heat pipe is placed on a top surface of an electronic component in order to cool the electronic component such as a semiconductor integrated circuit package. Since the heat pipe is linearly in contact with the electronic component, it is inferior in its heat transmission efficiency from the electronic component to the heat pipe.

A heat pipe having a flat shape has been known. However, the heat receiving surface of even such a heat pipe is not a perfect flat plane but a curved or rough plane. Therefore, even such a heat pipe having a flat shape is inferior in its efficiency of heat transmission from the heated component to the heat pipe.

Fins have been attached to the heat radiating portion of the heat pipe in order to improve the heat radiation of the heat pipe. Typically, a sleeve having a large number of fins on its outer surface is attached to the heat radiating portion of the heat pipe. Such a sleeve with fins is adhered and fixed on the heat radiating portion of the heat pipe by using, e.g. an adhesive. Alternatively, the heat pipe is inserted with pressure and fixed in the sleeve with fins.

When the sleeve with fins and the heat pipe are adhered and fixed by using an adhesive, a heat transmission loss is caused in the adhesive. When the heat pipe is inserted with pressure in the sleeve with fins, there is an unavoidably small gap between the sleeve and the pipe, and a heat transmission loss is caused in this gap.

SUMMARY OF THE INVENTION

It is an object of the present invention to provide a radiating device having a superior radiating characteristic compared to conventional radiating devices.

Another object of the present invention is to provide a radiating device having a similar function as a heat pipe and having a larger area for receiving heat from an electronic component.

A further object of the present invention is to provide a radiating device having a fin structure which does not generate any heat transmission loss.

The radiating device in accordance with the present invention includes a container body and a cap. The container body has a flat bottom wall serving as a heat receiving portion, and a cylindrical vertical wall extending upwardly from the edge of the bottom wall. The cap is positioned at an upper end portion of the vertical wall of the cylindrical container body for tightly sealing the inner space of the container body. An appropriate amount of working fluid serving as a heat carrier which repeats evaporation and condensation in the sealed space is kept in the container body. The container body includes a loop groove formed entirely along a corner where the inner surface of the bottom wall intersects or meets the inner wall of the vertical wall, a plurality of horizontal first grooves formed on the inner surface of the bottom wall to intersect the loop groove, and a plurality of vertical second grooves formed on the inner surface of the vertical wall to intersect the loop groove. All grooves form fluid paths.

The bottom wall of the container body is in surface-contact with the upper surface of an electronic component. Therefore heat from the electronic component is transmitted to the bottom wall with a high efficiency. The working fluid in the liquid phase on the bottom wall is evaporated by heat conduction from the bottom wall.

The working fluid, which has turned to steam or gas, radiates heat at the heat radiating portion, that is, the cap portion, where the steam or gas is condensed again. Most of the liquid returns through the cylindrical groove of the vertical wall and through the loop groove to the bottom wall. Since a plurality of horizontal grooves are formed on the bottom wall, the liquid expands over the entire bottom wall along the horizontal grooves, and is heated again to evaporate. While the liquid returns through the vertical grooves of the vertical cylindrical wall to the bottom wall, the liquid takes up heat from the vertical wall. Repetition of such evaporation and condensation of the working fluid improves the heat radiation effect of the radiating device.

If a large number of vertical grooves are provided over a substantial portion of the inner surface of the vertical cylindrical wall, the condensed liquid can effectively absorb heat along the entire vertical wall when the liquid passes through the vertical grooves. If a large number of horizontal grooves are provided over a substantial portion of the inner surface of the bottom wall, the liquid returning through the vertical grooves of the vertical cylindrical wall expands over most of the inner surface of the bottom wall, and is heated effectively by the bottom wall. Since the loop groove is formed to interconnect the vertical grooves and the horizontal grooves, the flow of liquid can be dispersed effectively.

A radiating device is generally placed such that the bottom wall is positioned on a horizontal plane. However, the bottom wall of a radiating device may possibly be positioned inclined from the horizontal plane or at right angles, dependent on the place of mounting. Even in that case, the working fluid in its liquid form rises along the horizontal groove because of capillary action along the horizontal grooves in the radiating device of the present invention. Therefore, if the bottom wall is inclined obliquely or vertically with respect to the horizontal plane, the working fluid expands entirely over the inner surface of the bottom wall, provided that the horizontal grooves are formed entirely over the inner surface of the bottom wall.

In a preferred embodiment, the cap is provided with a plurality of radiating fins on its outer surface, whereby the area of heat radiation of the cap is increased, improving the heat radiation efficiency.

In a more preferred embodiment, the cap includes a plurality of heat absorbing fins on its inner surface, whereby the area of heat absorption of the cap is increased. Therefore, the evaporation heat in the container body can be effectively transmitted to the cap.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
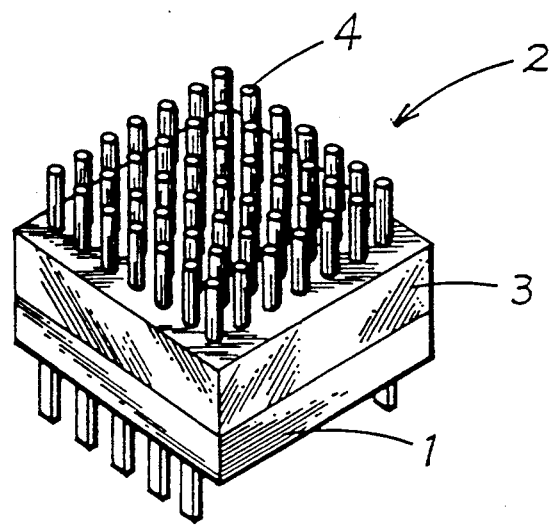
FIG. 1 is a perspective view showing an example of a conventional heat radiating device.
Figure 2:
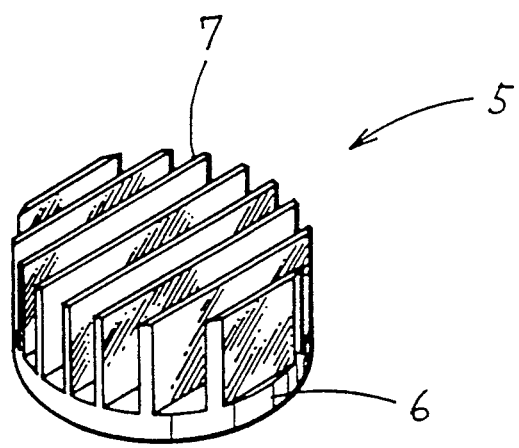
FIG. 2 is a perspective view showing another example of a conventional heat radiating device.
Figure 3:
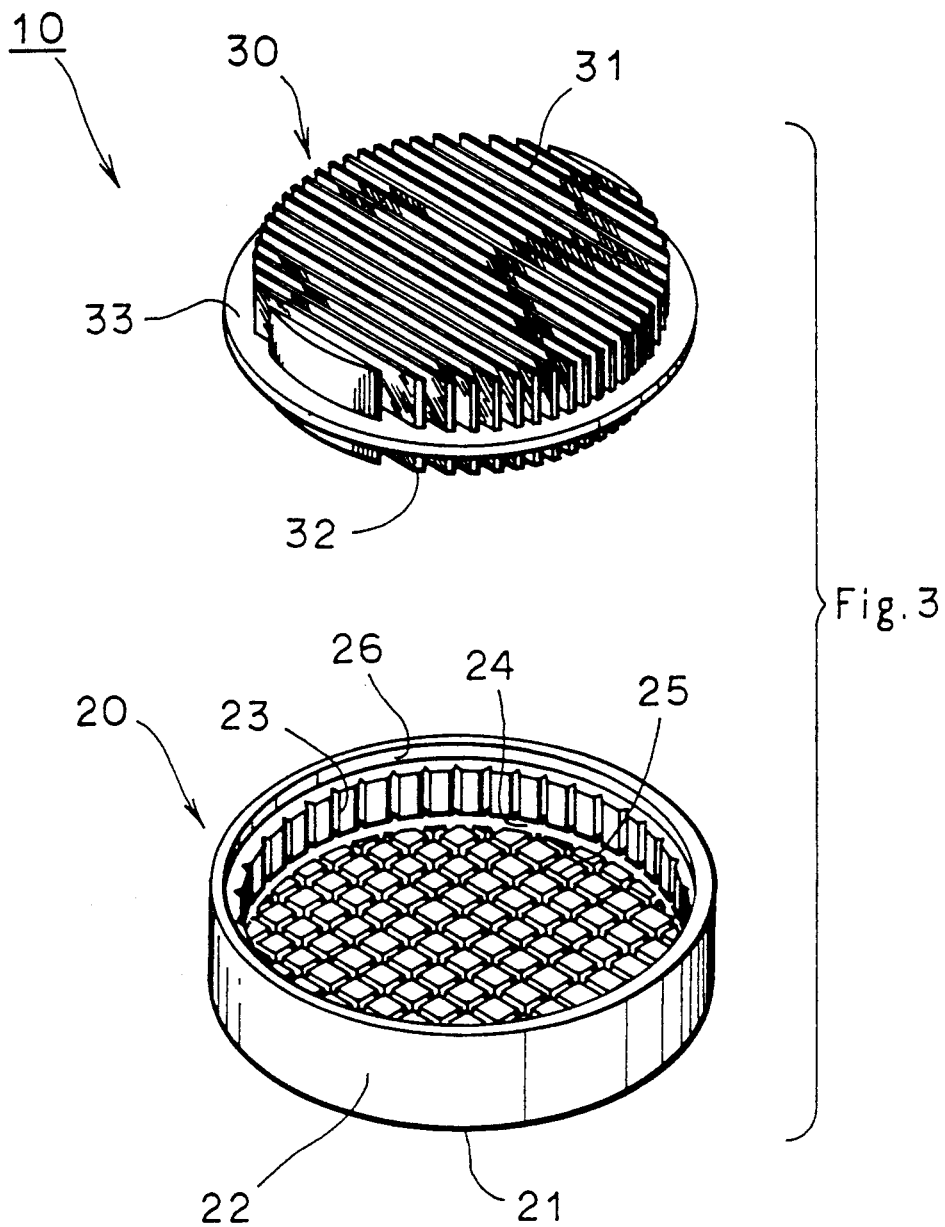
FIG. 3 is an exploded perspective view of an embodiment of the present invention illustrating a cap and a body section.
Figure 4:
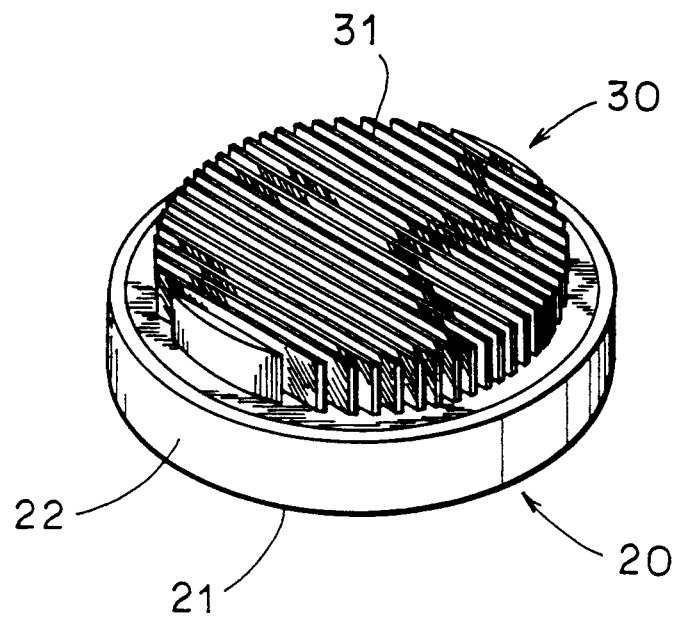
FIG. 4 is a perspective view of the embodiment of FIG. 3 in an assembled state.
Figure 5:
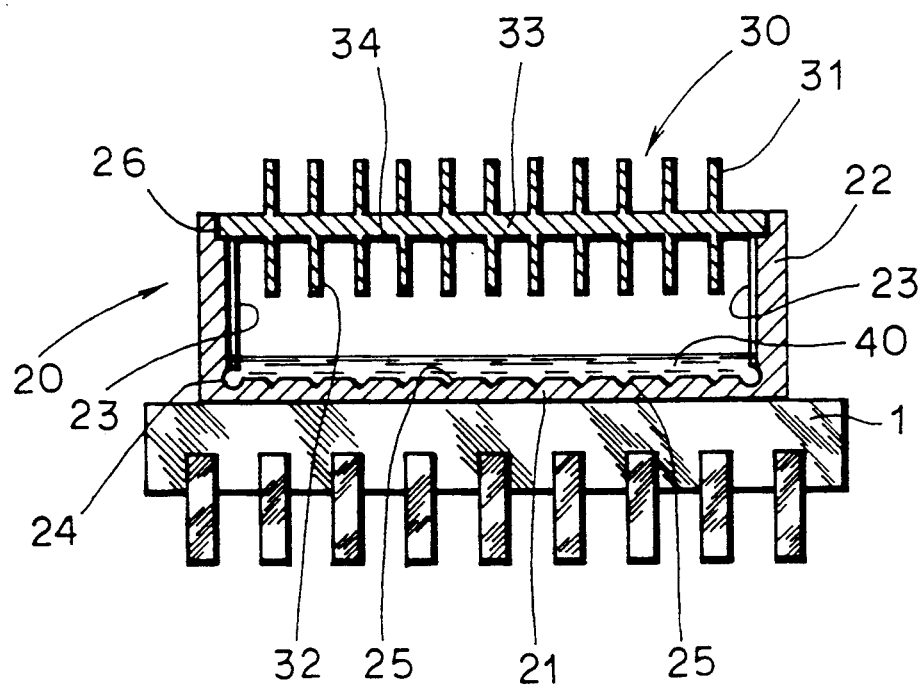
FIG. 5 is a cross section of another embodiment of the present invention, wherein a cap and a circuit package have fins.

A heat radiating device 10 in accordance with one embodiment of the present invention shown in FIGS. 3 to 5 includes a container body 20 and a cap 30. The container body 20 has a flat bottom wall 21 serving as a heat receiving portion, and a side wall 22 extending upwardly from the edge of the bottom wall. In the embodiment shown, the side wall 22 has a cylindrical shape.

As shown in FIG. 5, the bottom wall 21 of the container body 20 is in surface-contact with the upper surface of a semiconductor integrated circuit package 1. Therefore, heat emitted from the semiconductor integrated circuit package 1 is transmitted efficiently.

As shown in FIG. 5, a step portion 26 with a smaller wall thickness than the wall 22 is formed at an inner surface of the upper end of the side wall 22. The edge of the cap 30 is fitted in the step portion 26 to form a tight seal for the inner space in the container body 20.

Figure 6:
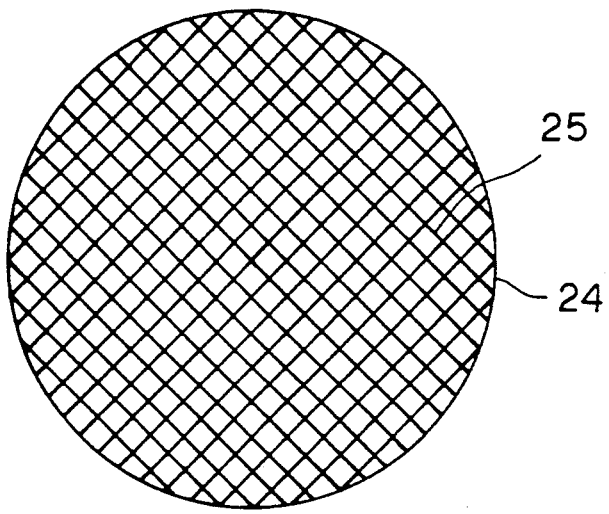
FIG. 6 is an illustration showing a checkerboard pattern of grooves.

At a corner portion where the inner surface of the container body 20 intersects or meets the inner surface of the vertical wall 22, a V-shaped groove or loop groove 24 is formed running all around the bottom wall. On the inner surface of the bottom wall 21, a plurality of first grooves 25 are formed to intersect the loop groove 24. As shown in FIG. 6, in this embodiment, the first grooves 25 are formed in a matrix shape or checkerboard pattern extending over a substantial portion of the inner surface of the bottom wall 21.

As is apparent from FIG. 3, a large number of second grooves 23 are formed to intersect the loop groove 24 on the inner surface of the side wall 22. The second grooves 23 are formed a substantial portion of over the inner surface of the side wall 22. Each second groove 23 extends to reach the step portion 26. A working fluid 40 is held in the inner space of the container body 20, which is tightly sealed before the pressure therein is reduced. An appropriate amount of the working fluid 40 serves as a heat carrier that is repeatedly evaporated and condensated. FIG. 5 shows that the working fluid 40 is in liquid phase. When the bottom wall 21 of the container body 20 is heated by heat conduction from the semiconductor integrated circuit package 1, the working fluid 40 evaporates into steam or vapor. The vapor gives off heat at the cap 30 whereby it is condensed again and turned to liquid.

In order to improve the effect of heat radiation of the radiating device 10, the cap 30 preferably includes a plurality of heat radiating fins 31 on its outer surface and a plurality of heat absorbing fins 32 on its inner surface. By the provision of the plurality of heat radiating fins 31, the area of heat radiation of the radiating device 10 is increased, improving the heat dissipating efficiency. The plurality of heat absorbing fins 32 increases the area of heat absorption on the inner surface of the cap 30. Therefore, the heat of the working fluid which has turned to vapor can be transmitted to the cap 30 efficiently. In order to prevent a heat transmission loss, the heat radiating fins 31 and heat absorbing fins 32 are formed integrally with the cap 30.

The liquid as the working fluid 40 which has been condensed at the inner surface of the cap 30 flows along the corner portions 34 where a disc shaped plate 33 and the heat absorbing fins 32 of the cap 30 intersect, and it reaches the side wall 22 of the container body 20. The liquid passes through the second grooves 23 of the side wall 22 and through the loop groove 24 to reach the bottom wall 11 which is exposed to heat generated by the package 1. The liquid takes up heat from the cap 30 and from the container body 20 during its movement.

The liquid which has returned to the bottom wall 21 is dispersed over most of the bottom wall 21 as it flows along the first grooves 25. Therefore, the liquid is heated efficiently by the bottom wall 21 and evaporates again.

In the state shown in FIG. 5, the bottom wall 21 of the container body 20 is positioned on a horizontal plane. However, dependent on the place of mounting of the radiating device 10, the bottom wall 21 may possibly be positioned at an inclined angle relative to the horizontal plane or it may be positioned vertically. Even in that case, the liquid as a working fluid which has returned to the bottom wall 21 flows along the now horizontal grooves 25 by capillary action and is dispersed over the whole surface of the bottom wall 21. Accordingly, the effect of heat radiation of the heat radiating device 10 is not affected by its positional orientation.

Figure 7:
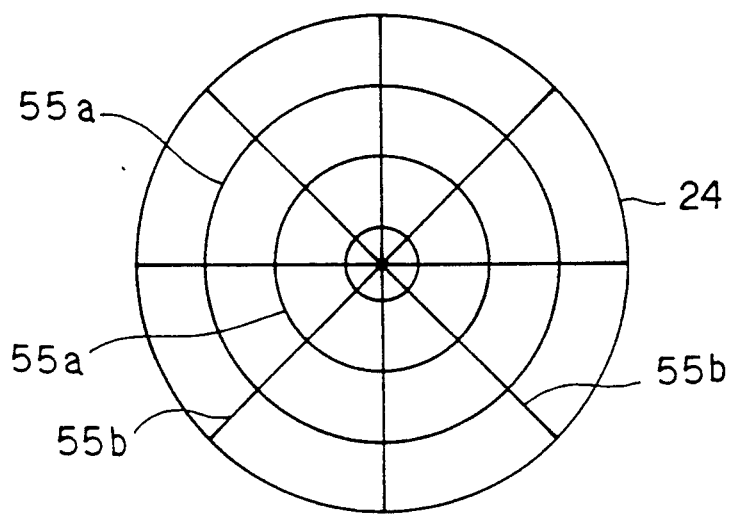
FIG. 7 is an illustration showing a circular and radial pattern of grooves.
Figure 8:
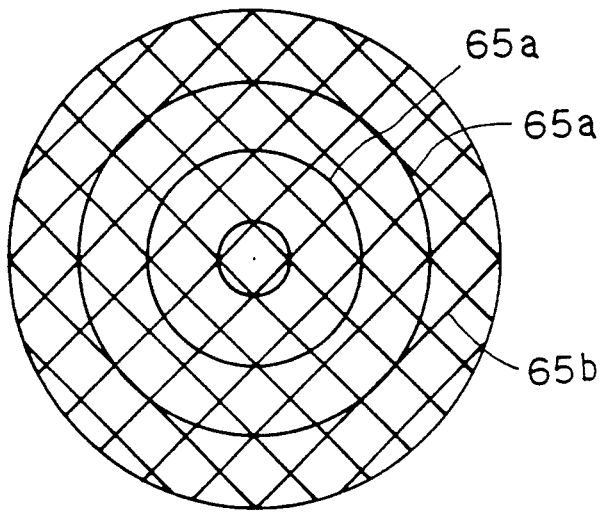
FIG. 8 is an illustration showing a checkerboard and radial pattern of grooves.

In the above described embodiment, the first grooves 25 are formed in a matrix over the entire inner surface of the bottom wall 21. However, the groove pattern of the first grooves 25 can be changed as shown in FIGS. 6, 7, and 8. In FIG. 6 a checkerboard pattern of grooves is formed. In FIG. 7 a plurality of circular grooves 55a and a plurality of radial grooves 55b intersect each other. In FIG. 8 a plurality of circular grooves 65a and a plurality of checkerboard grooves 65b insect each other.

As described above, according to the present invention, a heat radiating device having a superior heat dissipation efficiency has been provided.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A heat radiating device, comprising: a container body having a flat bottom wall with a circular peripheral edge serving as a heat receiving portion and a cylindrical side wall extending upwardly from said circular peripheral edge of said bottom wall; a cap arranged at an upper end portion of said cylindrical side wall for tight-sealing an inner space in said container body; and a working fluid as a heat carrier kept in said inner space of said container body wherein evaporation and condensation are repeated; and wherein said container body comprises a capillary loop groove formed in and along a corner portion where an inner surface of said bottom wall and an inner surface of said cylindrical side wall meet, a plurality of first capillary grooves formed on said inner surface of said bottom wall, said first capillary grooves intersecting said capillary loop groove, a plurality of second capillary grooves formed on said inner surface of said cylindrical side wall to also intersect said capillary loop groove, and wherein said capillary loop groove, said first capillary grooves and said second capillary grooves form fluid paths for said working fluid by capillary action.

2. The heat radiating device of claim 1, wherein said cap includes a plurality of heat radiating fins on an outer surface of said cap.

3. The heat radiating device of claim 1, wherein said cap includes a plurality of heat absorbing fins on an inner surface of said cap.

4. The heat radiating device of claim 1, wherein said cap includes a plurality of heat radiating fins on an outer surface of said cap and a plurality of heat absorbing fins on an inner surface of said cap.

5. The heat radiating device of claim 4, wherein said heat radiating fins and said heat absorbing fins are formed integrally with said cap.

6. The heat radiating device of claim 1, wherein said cylindrical side wall comprises a step portion having a smaller thickness than said cylindrical wall, said step portion being positioned at an inner surface of an upper end of said cylindrical wall, and wherein an edge of said cap is fitted in said step portion.

7. The heat radiating device of claim 1, wherein said first capillary grooves are formed in a matrix shape covering a substantial proportion of said inner surface of said bottom wall.

8. The heat radiating device of claim 1, wherein said second capillary grooves are formed to cover a substantial proportion of said inner surface of said cylindrical side wall.

9. The heat radiating device of claim 1, wherein said first capillary grooves and said second capillary grooves are interconnected by said capillary loop groove, to form said fluid paths as interconnected fluid paths.

10. The heat radiating device of claim 1, wherein said first capillary grooves comprise a checkerboard pattern of grooves on said bottom wall.

11. The heat radiating device of claim 1, wherein said first capillary grooves comprise circular grooves and radial grooves intersecting said circular grooves.

12. The heat radiating device of claim 1, wherein said first capillary grooves comprise checkerboard grooves and circular grooves intersecting said checkerboard grooves.

* * * * *